(12) United States Patent
Shim (10) Patent No.: US 7,294,522 B2
(45) Date of Patent: Nov. 13, 2007

(54) CMOS IMAGE SENSOR AND METHOD FOR FABRICATING THE SAME

(75) Inventor: Hee Sung Shim, Seoul (KR)

(73) Assignee: Donogbu Electronics Co., Ltd., Seoul (KR)

( * ) Notice: Subject to any disclaimer, the term of this patent is extended or adjusted under 35 U.S.C. 154(b) by 64 days.

(21) Appl. No.: 11/318,502

(22) Filed: Dec. 28, 2005

(65) Prior Publication Data

US 2006/0138471 A1    Jun. 29, 2006

(30) Foreign Application Priority Data

Dec. 29, 2004    (KR) .................... 10-2004-0114784

(51) Int. Cl.
*H01L 21/00* (2006.01)
*H01L 21/8238* (2006.01)

(52) U.S. Cl. .................... 438/57; 438/48; 438/199; 438/223; 438/514; 438/592; 257/19; 257/225; 257/237; 257/292; 257/458; 257/E21.347; 257/E21.106

(58) Field of Classification Search .............. 438/57, 438/48, 199, 223, 514, 592; 257/19, 225, 257/237, 292, 458

See application file for complete search history.

(56) References Cited

U.S. PATENT DOCUMENTS

| 2003/0127666 A1* | 7/2003 | Lee | 257/225 |
| 2005/0205904 A1* | 9/2005 | Hong | 257/291 |
| 2005/0277239 A1* | 12/2005 | Han | 438/199 |

FOREIGN PATENT DOCUMENTS

KR    10-2003-0002877 A    1/2003

\* cited by examiner

*Primary Examiner*—Michael Lebentritt
*Assistant Examiner*—Mohsen Ahmadi
(74) *Attorney, Agent, or Firm*—McKenna Long & Aldridge LLP (57) ABSTRACT

A CMOS image sensor and a method for fabricating the same are disclosed, in which a dead zone and a dark current are simultaneously reduced by selective epitaxial growth. The CMOS image sensor includes a first conductive type semiconductor substrate, a second conductive type impurity ion area, a gate electrode, an insulating film formed on an entire surface of the semiconductor substrate including the gate electrode and excluding the second conductive type impurity ion area, and a silicon epitaxial layer formed on the second conductive type impurity ion area and doped with first conductive type impurity ions.

5 Claims, 15 Drawing Sheets

CMOS IMAGE SENSOR AND METHOD FOR FABRICATING THE SAME

This application claims the benefit of Korean Patent Application No. 10-2004-114784, filed on Dec. 29, 2004, which is hereby incorporated by reference for all purposes as if fully set forth herein.

BACKGROUND OF THE INVENTION

1. Field of the Invention

The present invention relates to a complementary metal-oxide semiconductor (CMOS) image sensor and a method for fabricating the same, and more particularly, to a CMOS image sensor and a method for fabricating the same in which a dead zone and a dark current are simultaneously reduced.

2. Discussion of the Related Art

Generally, an image sensor is a semiconductor device that converts optical images to electrical signals. The image sensor can be classified as a charge coupled device (CCD) and a CMOS image sensor.

The CCD has drawbacks in its fabricating process because of a complicated driving mode, high power consumption, and multistage photolithographic processes. Also, it is difficult for a control circuit, a signal processing circuit, and an analog-to-digital converter to be integrated in a CCD chip. Thus, the CCD is not suitable for use in slim sized products. However, CMOS image sensors have received attention as the next generation technology for overcoming the drawbacks of CCDs.

The CMOS image sensor employs a switching mode that sequentially detects outputs of unit pixels using MOS transistors by forming the MOS transistors to correspond to the number of the unit pixels on a semiconductor substrate. CMOS technology that uses a control circuit and a signal processing circuit as peripheral circuits is employed.

The CMOS image sensor has advantages in that power consumption is low because of the CMOS technology. Also, a fabricating process is simple because of a relatively small number of photolithographic processing steps. Further, since the CMOS image sensor allows a control circuit, a signal processing circuit and an analog-to-digital converter to be integrated in its chip, it has an advantage in that a slim sized product can be obtained. Therefore, the CMOS image sensor is widely used for various application fields such as digital still cameras and digital video cameras.

Figure 1:
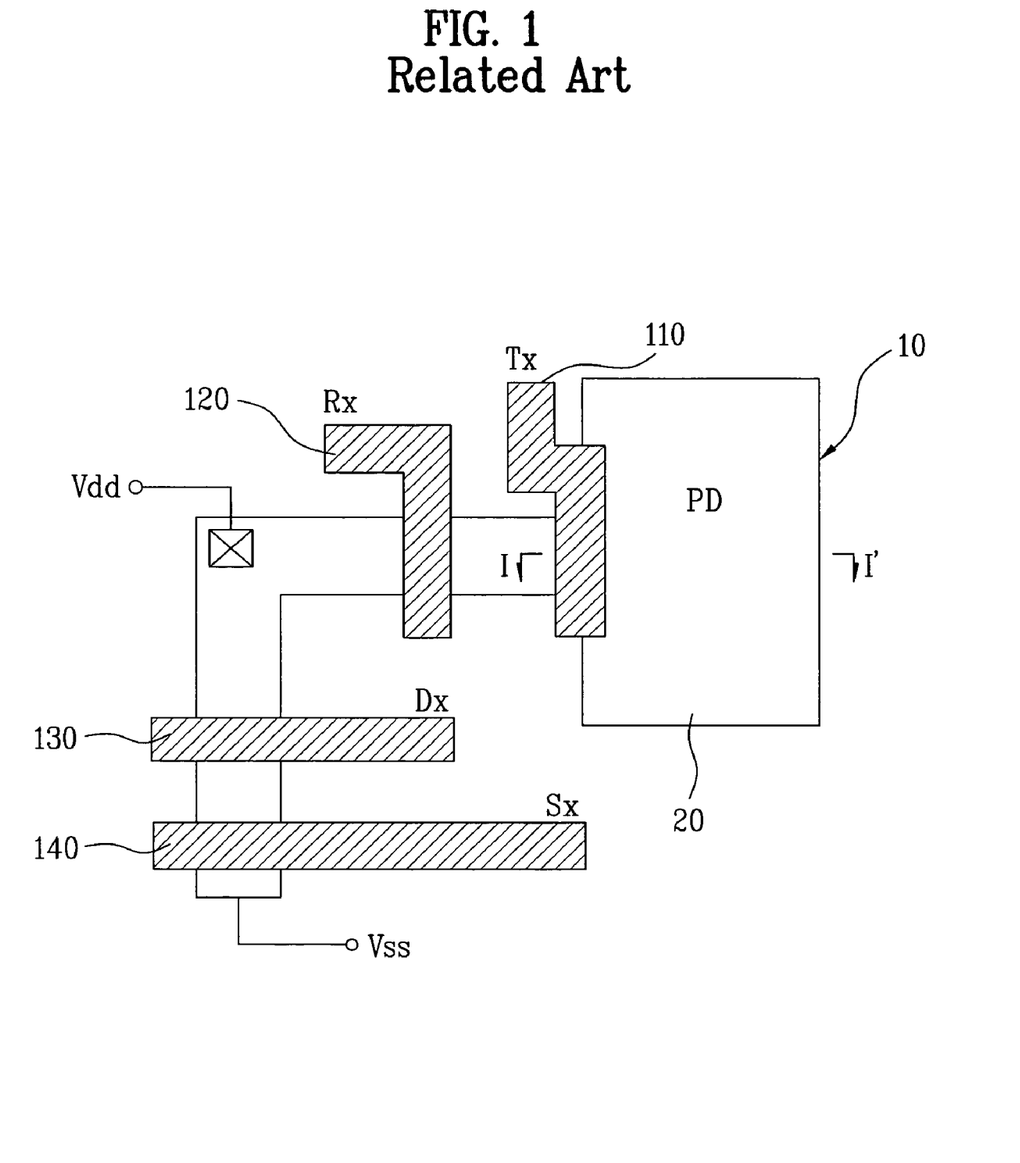
FIG. 1 is a layout illustrating a unit pixel of a 4T type CMOS image sensor including four transistors according to the related art.

A related art CMOS image sensor will be described with reference to FIGS. 1 and 2. FIG. 1 is a layout illustrating a unit pixel of a 4T type CMOS image sensor including four transistors, and FIG. 2 is an equivalent circuit 100 diagram illustrating the unit pixel of the CMOS image sensor shown in FIG. 1.

Figure 2:
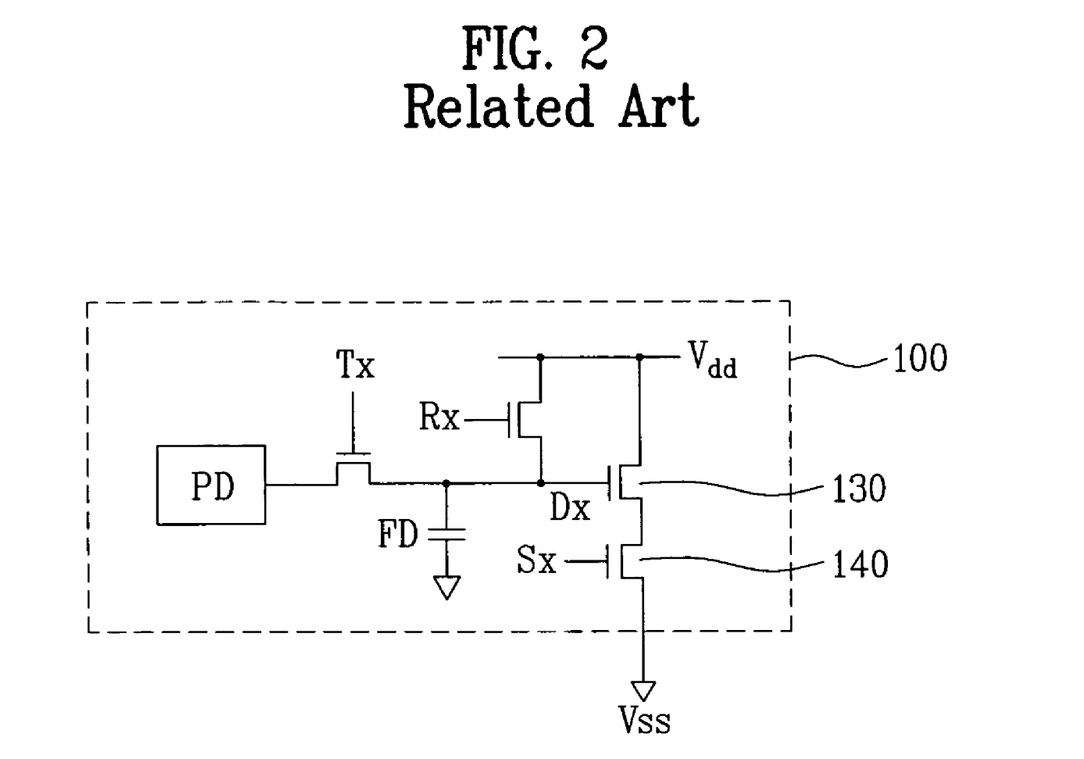
FIG. 2 is an equivalent circuit diagram illustrating the unit pixel of the CMOS image sensor shown in FIG. 1.

In the unit pixel of the 4T type CMOS image sensor, as shown in FIGS. 1 and 2, a photodiode (PD) 20 is formed in a wide portion of an active area 10, and gate electrodes 110, 120, 130, and 140 of four transistors, are formed to respectively overlap the other portions of the active area 10. A transfer transistor Tx, a reset transistor Rx, a drive transistor Dx, and a selection transistor Sx are respectively formed by the gate electrodes 110, 120, 130 and 140.

Impurity ions are implanted into the active area 10 of each transistor except portions below the gate electrodes 110, 120, 130 and 140, so that source and drain areas of each transistor are formed. Thus, a power voltage Vdd is applied to the source and drain areas between the reset transistor Rx and the drive transistor Dx, and a power voltage Vss is applied to the source and drain areas at one side of the selection transistor Sx.

The transfer transistor Tx transfers optical charges generated by the photodiode to a floating diffusion (FD) layer. The reset transistor Rx controls and resets the potential of the floating diffusion layer. The drive transistor Dx serves as a source follower. The selection transistor Sx serves as a switching transistor to read a signal of the unit pixel.

A method for fabricating the aforementioned related art CMOS image sensor will be described with reference to FIG. 3A to FIG. 3G. FIG. 3A to FIG. 3G are sectional views taken along line I-I' of the unit pixel of the CMOS image sensor shown in FIG. 1.

Figure 3A:
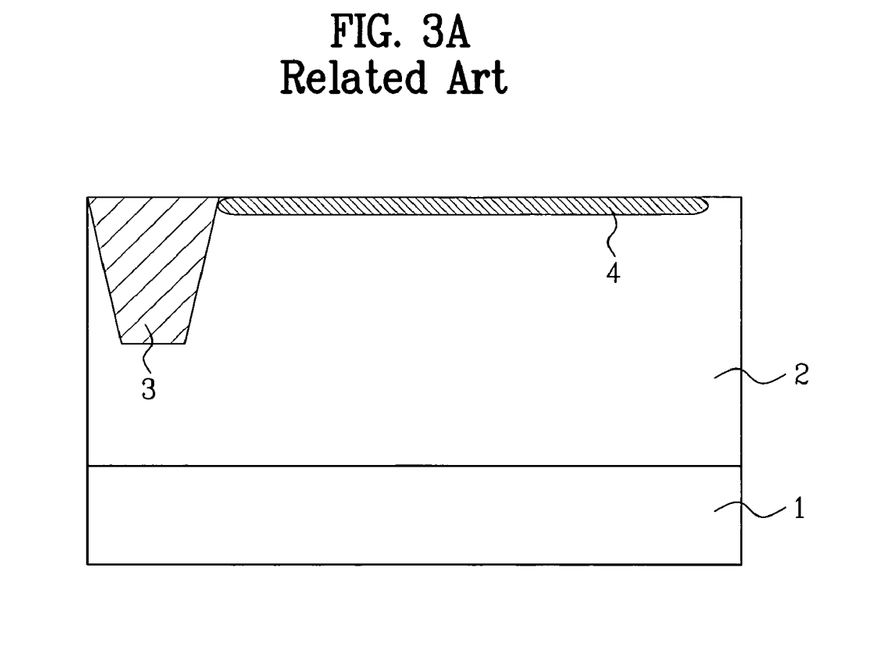
FIG. 3A to FIG. 3G are sectional views of a CMOS image sensor fabricated by a method according to related art methods.

First, as shown in FIG. 3A, a lightly doped P type (P-) epitaxial layer 2 is formed on a P type semiconductor substrate 1 defined by an active area and a device isolation area using a mask. Then, the lightly doped P type epitaxial layer 2 is etched at a predetermined depth by exposing and developing processes using the mask to form a trench. An oxide film is formed on the epitaxial layer 2. The trench is filled with the oxide film by a chemical mechanical polishing (CMP) process so as to form a device isolation film 3 in the device isolation area.

Impurity ions are implanted into the surface of the epitaxial layer 2 to correspond to the active area to form a P type impurity ion area 4. The P type impurity ion area 4 is used to control a threshold voltage in a channel area of the transfer transistor and to pin a surface voltage in the photodiode.

Figure 3B:
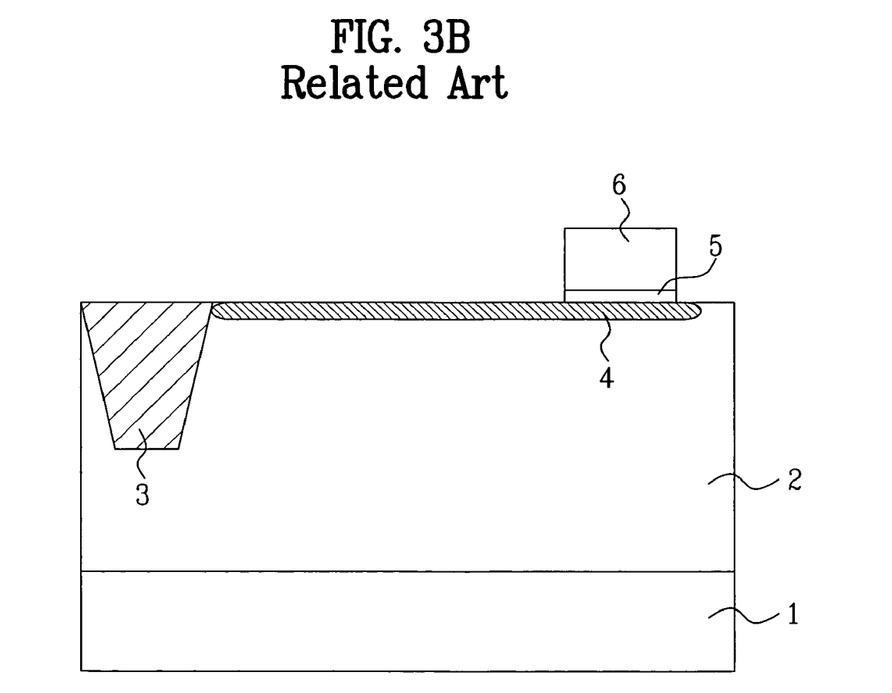

As shown in FIG. 3B, a gate insulating film and a conductive layer are sequentially formed on the entire surface of the substrate and then selectively dry-etched to form a gate insulating film 5 and a gate electrode 6 of each transistor including the transfer transistor.

Figure 3C:
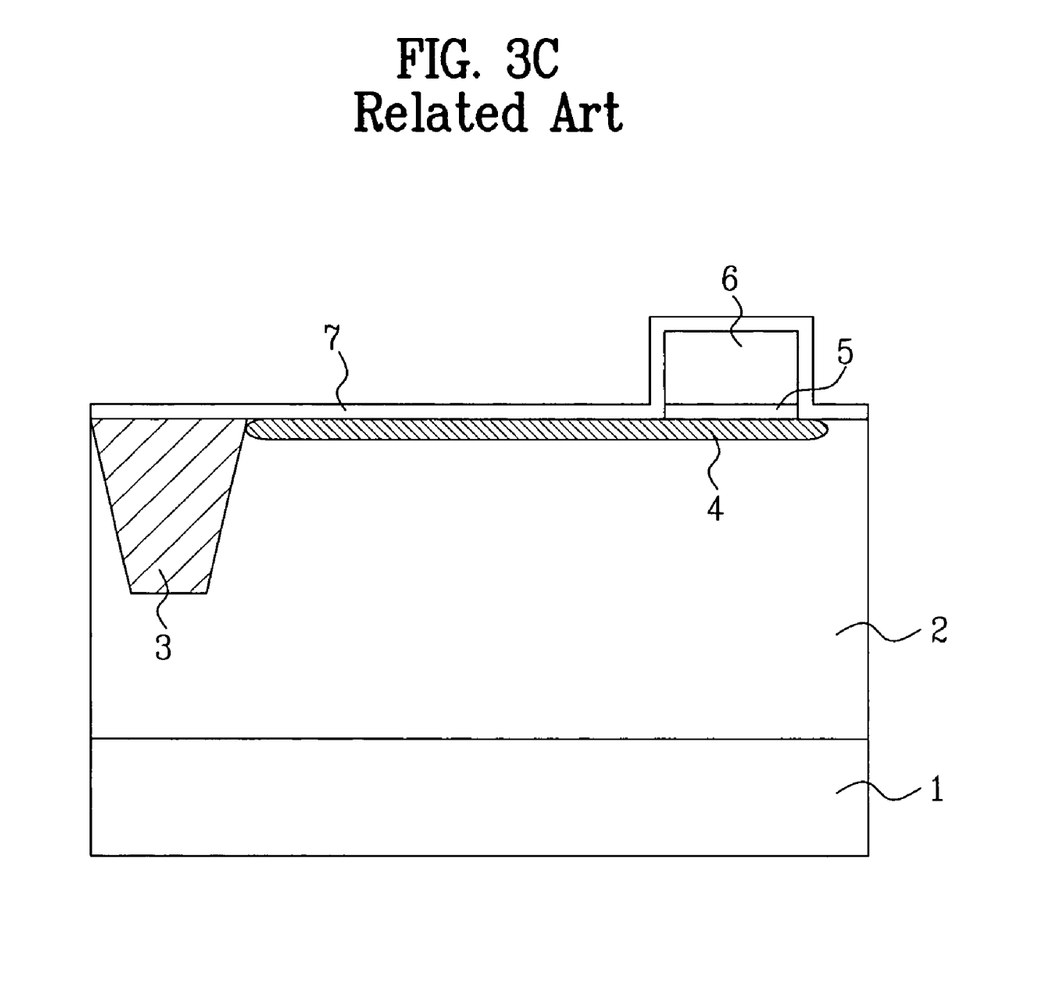

As shown in FIG. 3C, an insulating film 7 such as an oxide film is formed on the entire surface of the substrate including the gate electrode 6 to recover a damaged corner of the gate insulating film 5 and protect the surface of the epitaxial layer 2 during a later ion implantation process.

Figure 3D:
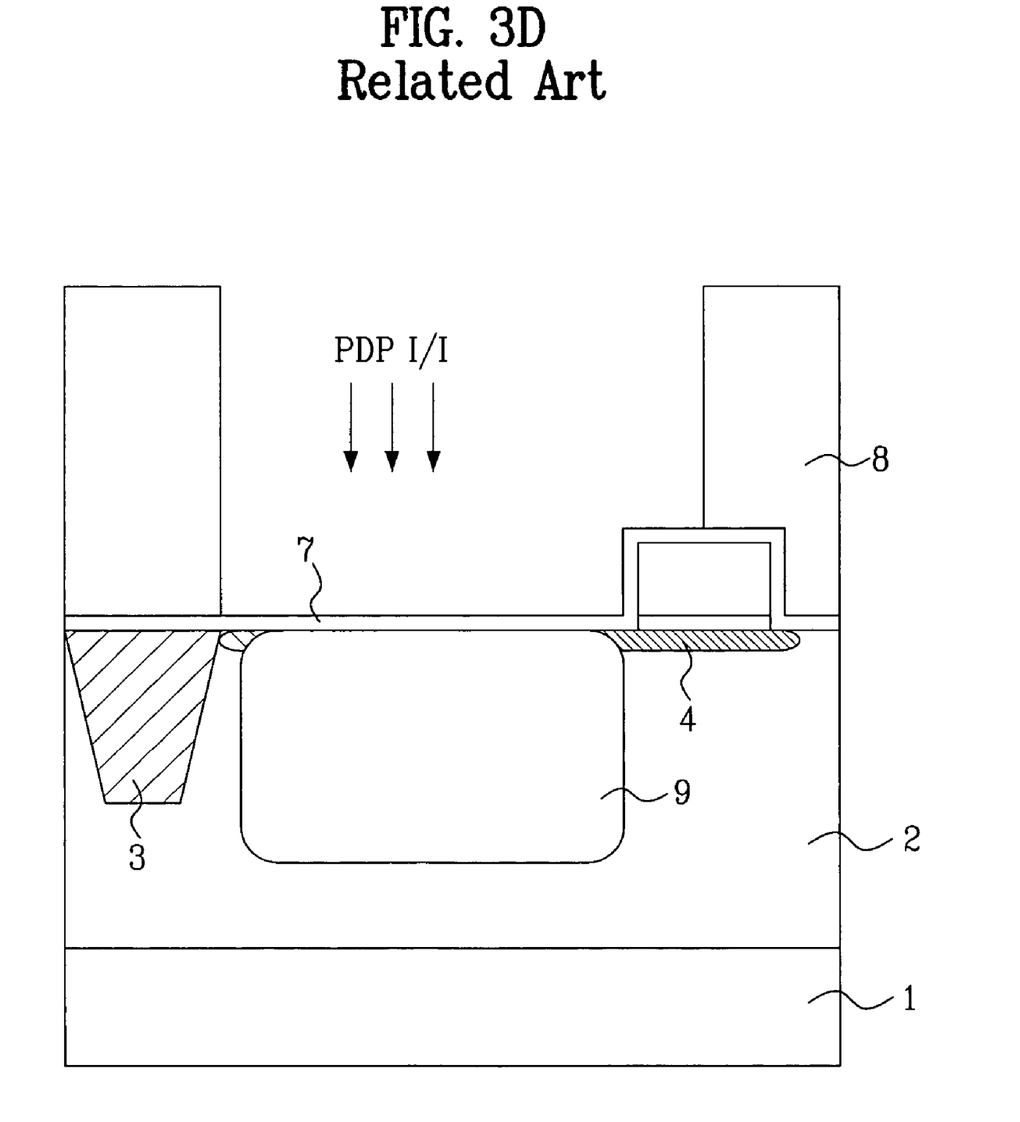

As shown in FIG. 3D, a photoresist film is coated on the entire surface and then removed by exposing and developing processes to form a photoresist pattern 8 that exposes the photodiode. The photoresist pattern 8 is formed to partially cover the active area adjacent the device isolation film 3 and to partially expose the gate electrode 6. N type impurity ions are implanted into the epitaxial layer 2 of the exposed photodiode by high energy ion implantation to form a photodiode N type impurity ion area 9.

Figure 3E:
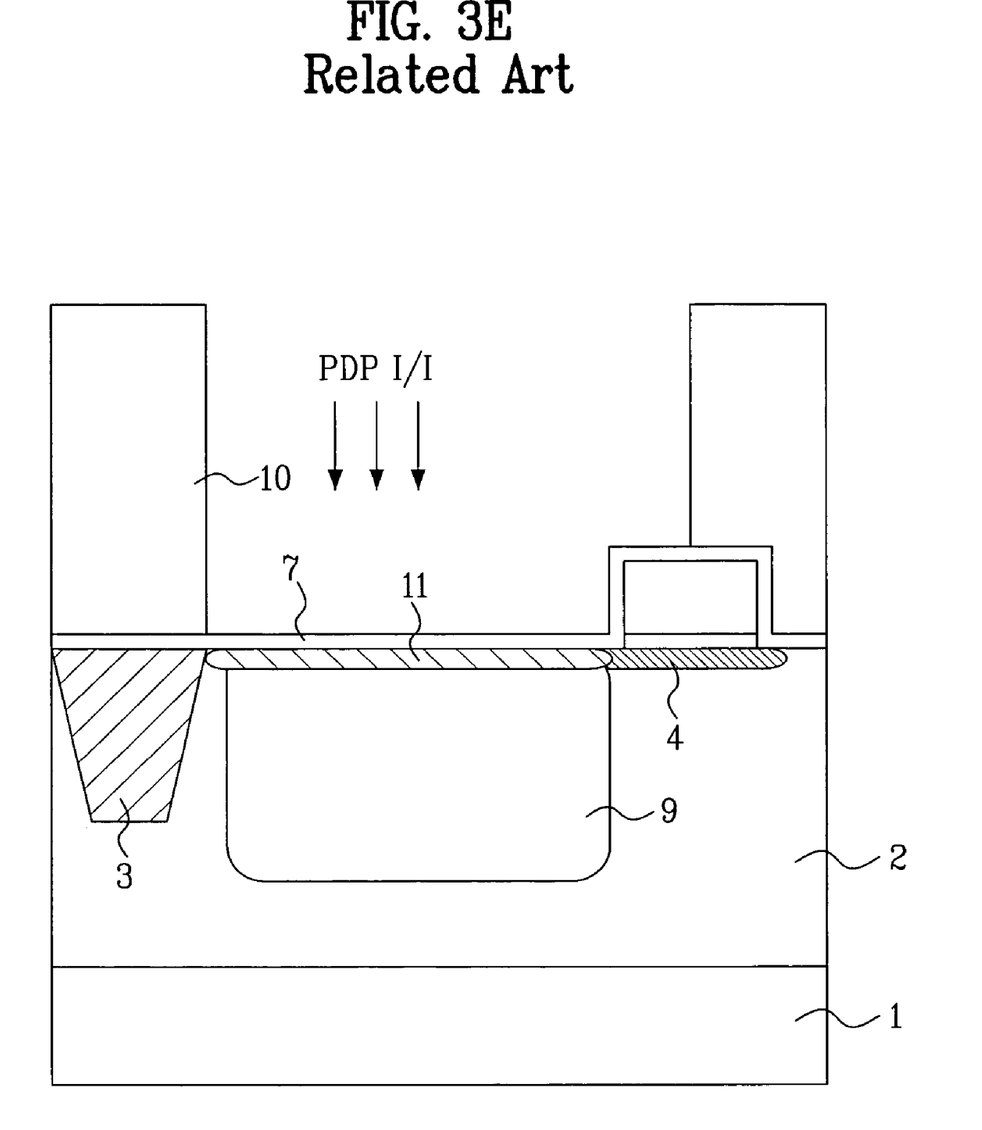

As shown in FIG. 3E, after the photoresist pattern 8 is removed, a photoresist pattern 10 is formed to expose the photodiode. P type impurity ions are implanted into the surface of the photodiode N type impurity ion area 9 to form a P type impurity ion area 11. The P type impurity ion area 11 has a doping level obtained by adding a doping level of the P type impurity ion area 4 thereto.

Figure 3F:
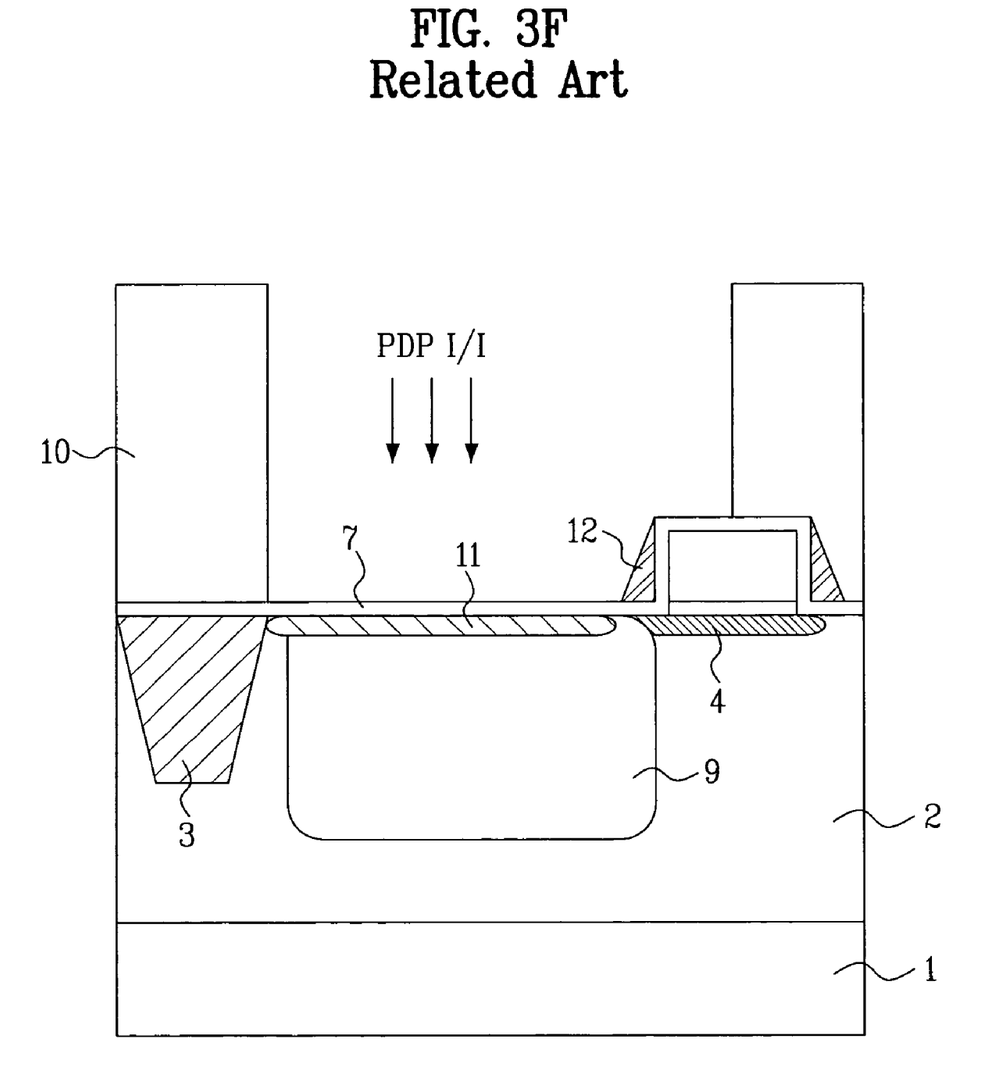

Instead of the process shown in FIG. 3E, as shown in FIG. 3F, an insulating film may be deposited on the entire surface and then removed by an anisotropic etching process to form spacers 12 at sidewalls of the gate electrode 6. After the photoresist pattern 10 is formed to expose the photodiode, P type impurity ions may be implanted into the surface of the photodiode N type impurity ion area 9 to form the P type impurity ion area 11.

Figure 3G:
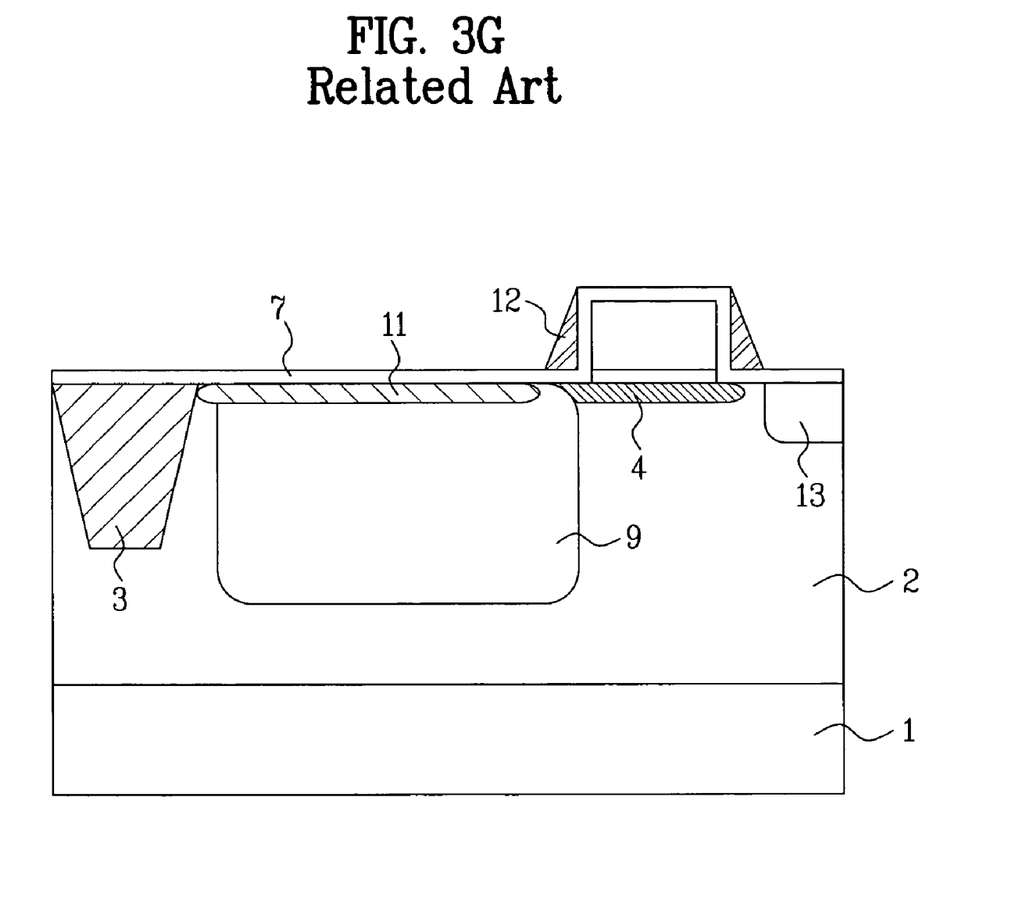

As shown in FIG. 3G, the photoresist pattern 10 is removed, and N type impurity ions are heavily implanted into the drain area at one side of the gate electrode 6 using a mask to form a heavily doped N type impurity ion area 13.

In the related art CMOS image sensor, the photodiode converts signals of light into electrical signals to generate optical charges. The generated optical charges move to the floating diffusion layer so as to gate the drive transistor Dx if the transfer transistor Tx is turned on. However, as shown in FIG. 3E, if the P type impurity ions are implanted before the spacers are formed, the epitaxial layer below the spacers is pinned. Characteristics of a dark current may be improved but the P type impurity ion doping level increases. As the P type impurity ion doping level increases, a potential barrier of the source area of the transfer transistor increases to reduce transfer efficiency of the optical charges. A problem then occurs in that a dead zone is formed. In the dead zone no signal is generated for a certain time period after light enters the sensor.

Furthermore, as shown in FIG. 3F, if the P type impurity ions are implanted after the spacers are formed at the sidewalls of the gate electrode, transfer efficiency of the optical charges may be improved. However, the surface of the photodiode is damaged during the dry-etching process that forms the spacers. Dark current is thereby increased.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is to provide a CMOS image sensor and a method for fabricating the same in which a dead zone and a dark current are simultaneously reduced by selective epitaxial growth.

Additional features and advantages of the invention will be set forth in the description which follows, and will be apparent from the description, or may be learned by practice of the invention. The objectives and other advantages of the invention may be realized and attained by the structure and method particularly pointed out in the written description and claims hereof as well as the appended drawings.

To achieve these and other advantages and in accordance with the purpose of the invention, as embodied and broadly described, a CMOS image sensor includes a first conductive type semiconductor substrate defined by a photodiode area and a transistor area, a second conductive type impurity ion area formed in the semiconductor substrate of the photodiode area, a gate electrode formed on the semiconductor substrate of the transistor area, an insulating film formed on an entire surface of the semiconductor substrate including the gate electrode and excluding the second conductive type impurity ion area, and a silicon epitaxial layer formed on the second conductive type impurity ion area and doped with first conductive type impurity ions.

In another aspect of the present invention, a method for fabricating a CMOS image sensor includes forming a first conductive type first impurity ion area in an active area of a semiconductor substrate defined by the active area and a field area, forming a gate electrode on a transistor area of the active area, forming an insulating film on an entire surface of the semiconductor substrate including the gate electrode, forming a second conductive type impurity ion area in a photodiode area of the active area, selectively removing the insulating film on the second conductive type impurity ion area, growing a silicon epitaxial layer on a surface of the second conductive type impurity ion area, and forming a first conductive type second impurity ion area in the silicon epitaxial layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 4A:
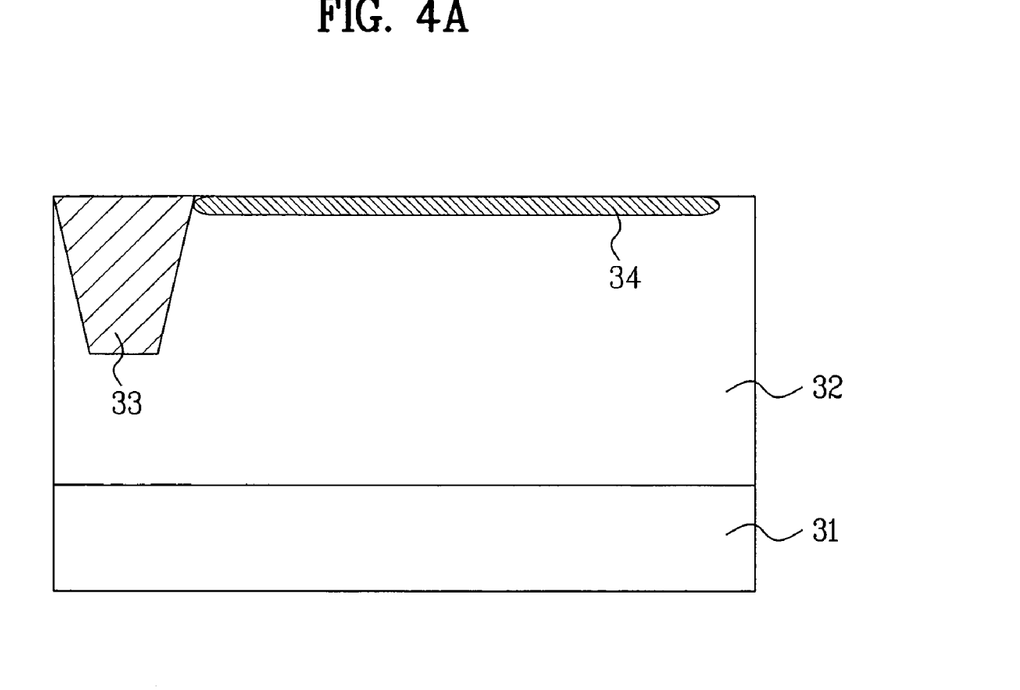
FIG. 4A to FIG. 4H are sectional views of a CMOS image sensor fabricated by a method according to an exemplary embodiment of the present invention.

As shown in FIG. 4A, a lightly doped P type (P−) epitaxial layer 32 is formed on a P type semiconductor substrate 31 defined by an active area and a device isolation area using a mask. Then, the lightly doped P type epitaxial layer 32 is etched at a predetermined depth by exposing and developing processes using the mask to form a trench. An oxide film is formed on the substrate so that the trench is filled with the oxide film. The oxide film is patterned by a chemical mechanical polishing (CMP) process to remain in the trench, so that a device isolation film 33 is formed in the device isolation area.

Impurity ions are implanted into a surface of the epitaxial layer 32 corresponding to the active area so as to form a P type impurity ion area 34. The P type impurity ion area 34 is used to control a threshold voltage in a channel area of a transfer transistor and to pin a surface voltage in a photodiode area.

Figure 4B:
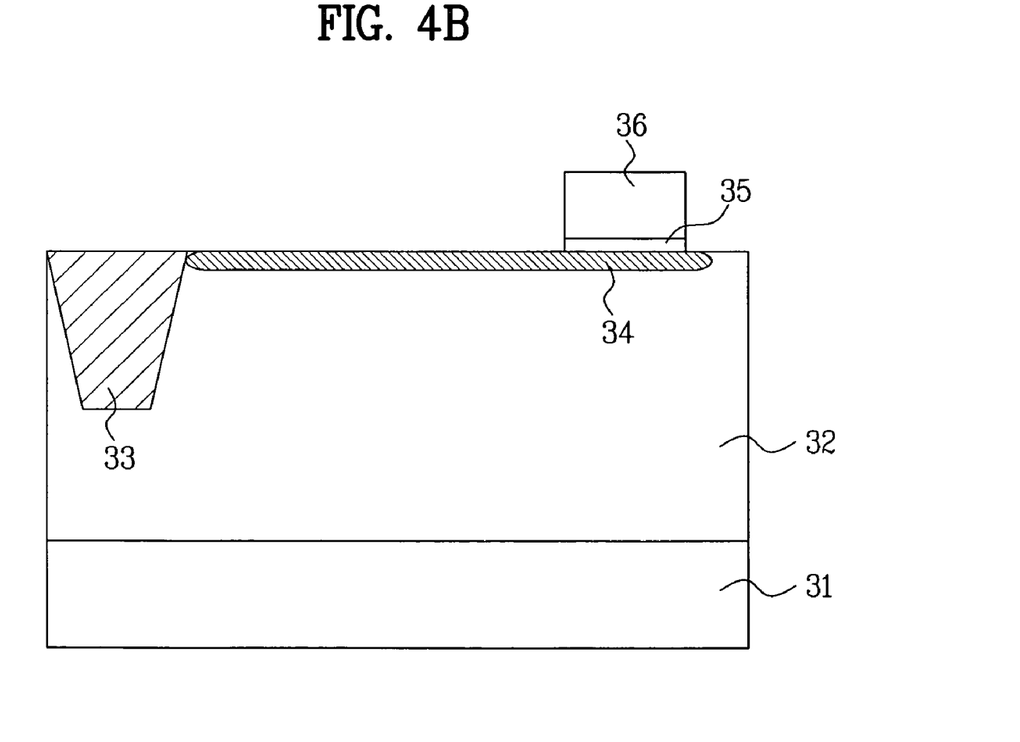

As shown in FIG. 4B, a gate insulating film and a conductive layer are sequentially formed on the entire surface of the substrate and then selectively dry-etched to form a gate insulating film 35 and a gate electrode 36 of each transistor including the transfer transistor.

Figure 4C:
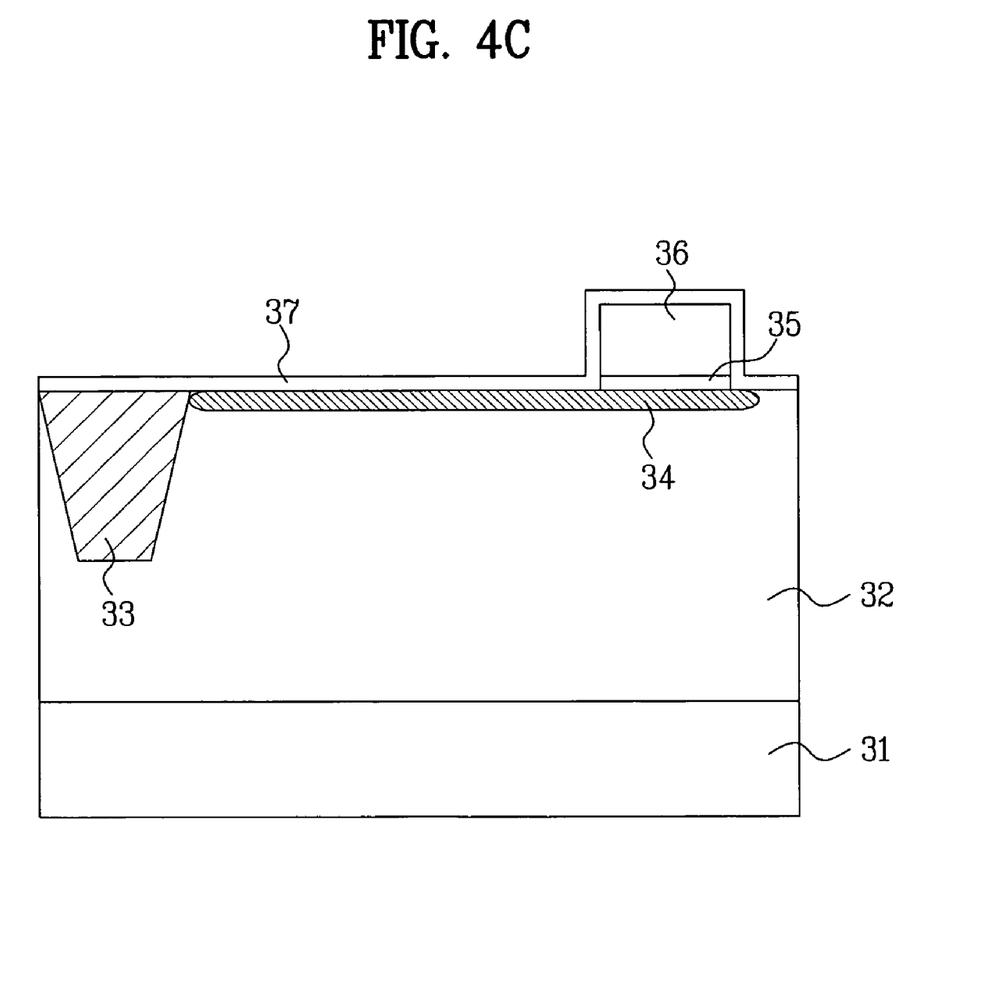

As shown in FIG. 4C, an insulating film 37, such as an oxide film, is formed on the entire surface of the substrate including the gate electrode 36 to recover a damaged corner of the gate insulating film 35 and to protect the surface of the epitaxial layer 32 during a later ion implantation process.

Figure 4D:
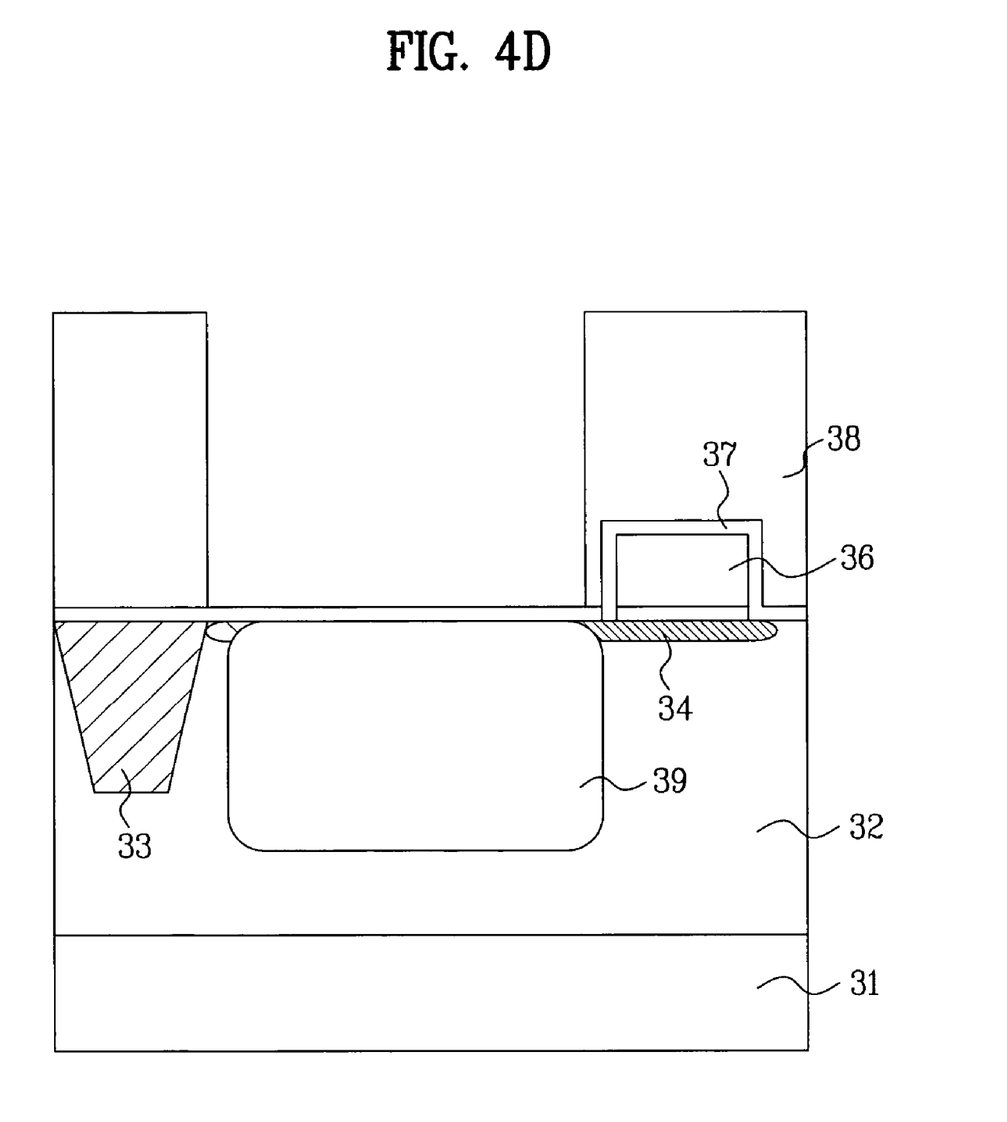

As shown in FIG. 4D, a photoresist film is coated on the entire surface and then removed by exposing and developing processes to form a photoresist pattern 38 that exposes the photodiode area. The photoresist pattern 38 is formed to partially cover the active area adjacent the device isolation film 33 and the gate electrode 36. The insulating film 37 exposed from the photoresist pattern 38 is selectively removed by a wet-etching process. The insulating film 37 at sidewalls of the gate electrode 36 and on the gate electrode 36 may not removed. Then, N type impurity ions are implanted into the epitaxial layer 32 of the exposed photodiode area by high energy ion implantation to form an N type impurity ion area 39 in the photodiode area.

Figure 4E:
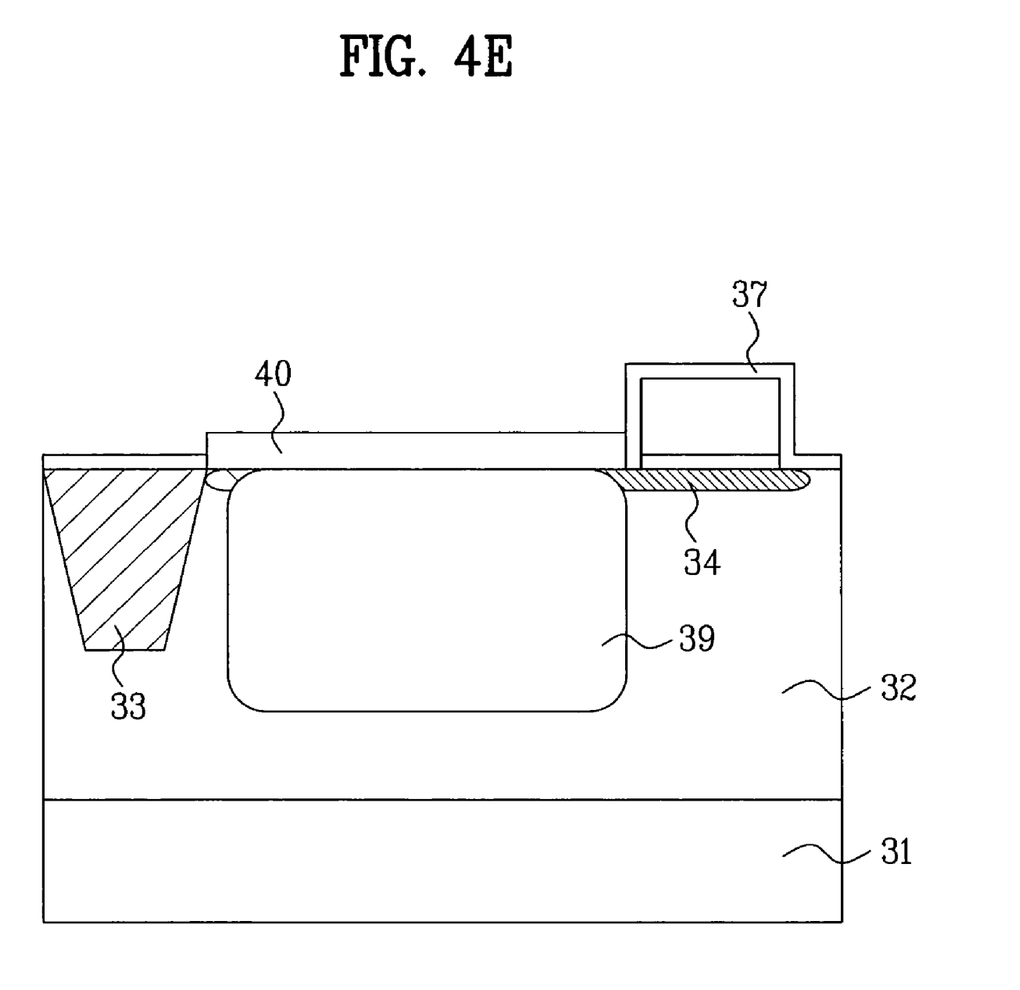

As shown in FIG. 4E, after the photoresist pattern 38 is removed, a silicon epitaxial layer 40 is grown using a selective epitaxial growth process on the surface of the photodiode area from which the insulating film 37 is removed. The silicon epitaxial layer 40 is electrically isolated from the gate electrode 36 by the insulating film 37.

Figure 4F:
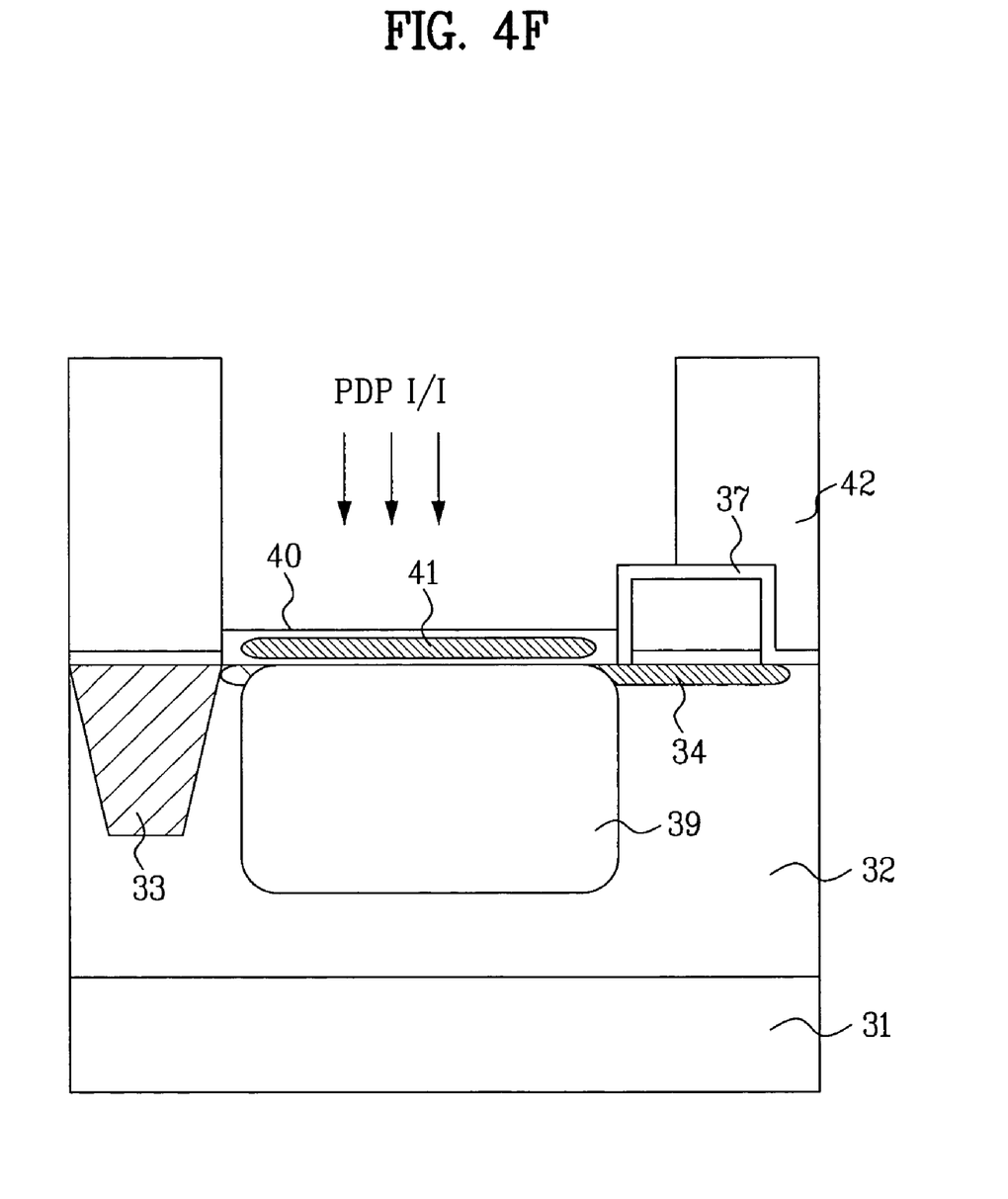

As shown in FIG. 4F, a photoresist film 42 is coated on the entire surface and then patterned by exposing and developing processes to expose the photodiode area. P type impurity ions are implanted into the silicon epitaxial layer 40 to form a P type impurity ion area 41 using the patterned photoresist film 42 as a mask.

Figure 4G:
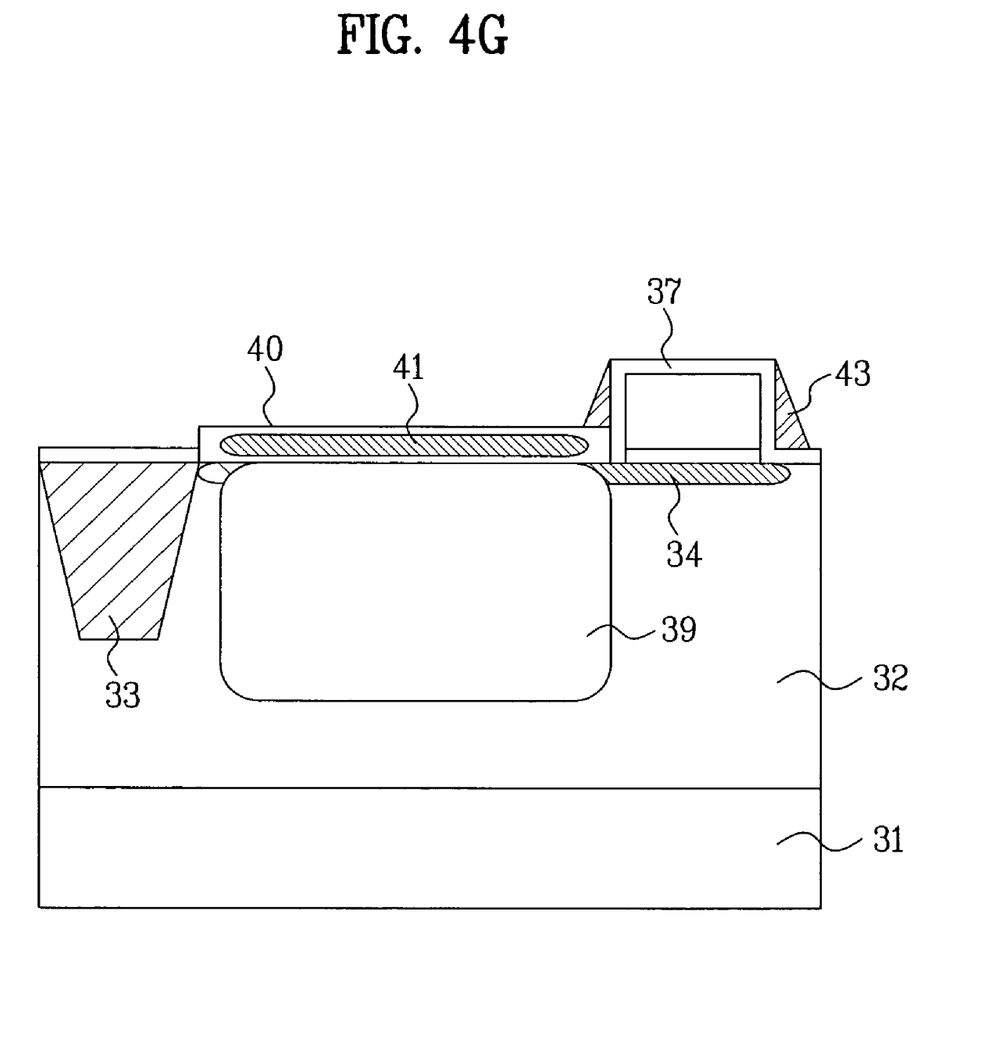

As shown in FIG. 4G, after the photoresist film 42 is removed, an insulating film is deposited on the entire surface and then removed by an anisotropic etching process to form spacers 43 at the sidewalls of the gate electrode 36.

Figure 4H:
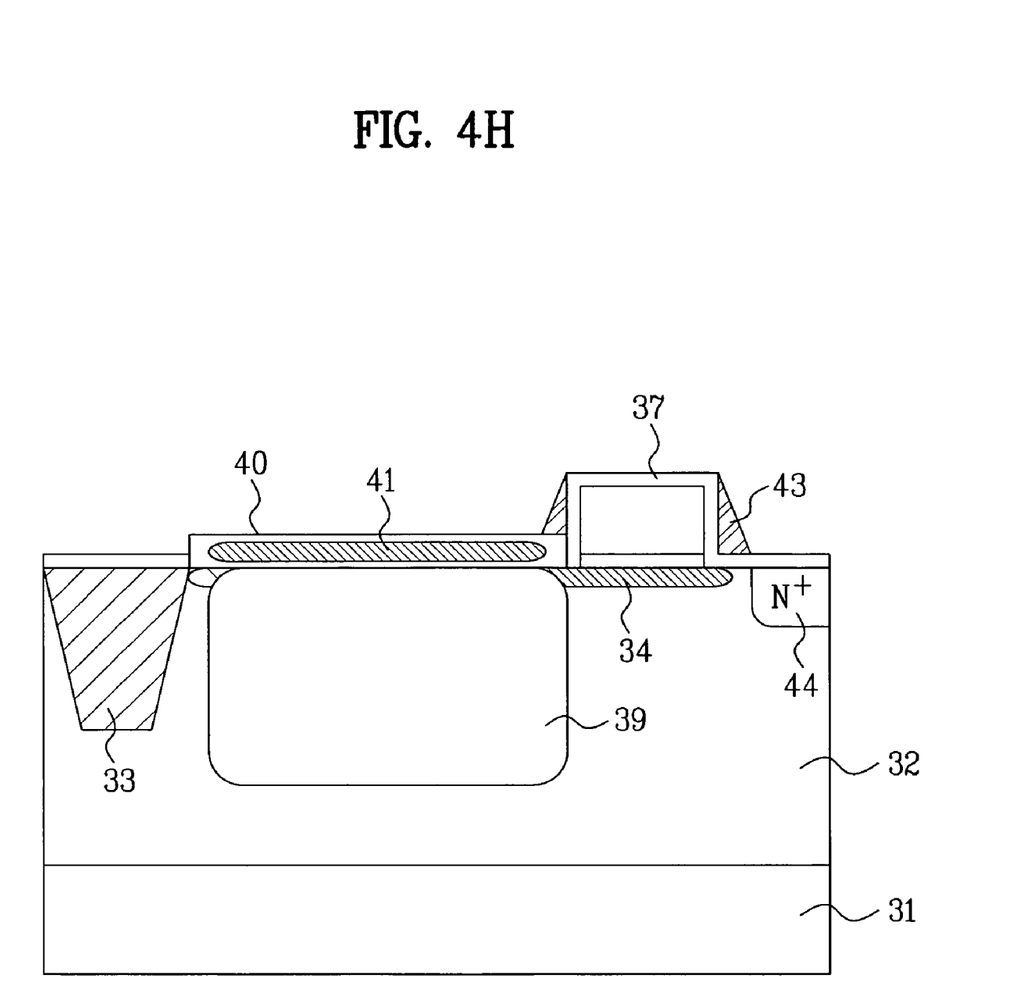

As shown in FIG. 4H, N type impurity ions are heavily implanted into a drain area at one side of the gate electrode 36 using a mask to form a heavily doped N type impurity ion area 44.

In the CMOS image sensor according to an exemplary embodiment of present invention, the P type epitaxial layer 32 defined by the photodiode area and a transistor area is provided to form the N type impurity ion area 39 in the photodiode area of the P type epitaxial layer 32. The silicon epitaxial layer 41, into which the P type impurity ions are implanted, is selectively formed on the P type epitaxial layer 32 of the photodiode area. The gate insulating film 35 and the gate electrode 36 are formed on the P type epitaxial layer 32 of the transistor area, and the P type impurity ion area 34 is formed in the P type epitaxial layer 32 below the gate electrode 36.

The silicon epitaxial layer 41 into which the P type impurity ions are implanted is isolated from the gate electrode 36 by the insulating film 37. The spacers 43 are formed at the sidewalls of the gate electrode 36 on the silicon epitaxial layer 41 into which the P type impurity ions are implanted.

As described above, the CMOS image sensor and the method for fabricating the same have the following advantages. Since the P type impurity ion area shown in FIG. 4A is extended to the portion below the spacers of the transfer transistor, it is possible to reduce the dark current of the image sensor. In addition, since the silicon epitaxial layer is formed on the surface of the photodiode area using the selective epitaxial growth process and the P type impurity ion area is formed on the silicon epitaxial layer to pin the surface voltage of the photodiode area, the P type impurity ion area of the photodiode area is higher than the channel area of the transfer transistor. The potential barrier in the source area of the transfer transistor does not increase, and transfer efficiency of the optical charges can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS image sensor comprising:

forming a first conductive type first impurity ion area in an active area of a semiconductor substrate defined by the active area and a field area;

forming a gate electrode on a transistor area of the active area;

forming an insulating film on an entire surface of the semiconductor substrate including the gate electrode;

forming a second conductive type impurity ion area in a photodiode area of the active area;

selectively removing the insulating film on the second conductive type impurity ion area;

growing a silicon epitaxial layer on a surface of the second conductive type impurity ion area; and forming a first conductive type second impurity ion area in the silicon epitaxial layer.

2. The method of claim 1, wherein the silicon epitaxial layer is formed on the second conductive type impurity ion area through a selective epitaxial growth process.

3. The method of claim 1, wherein the step of selectively removing the insulating film further comprises:

leaving the insulating film at sidewalls of the gate electrode so as to isolate the silicon epitaxial layer from the gate electrode through the insulating film.

4. The method of claim 1, further comprising forming spacers at sidewalls of the gate electrode, and forming a heavily doped second conductive type impurity ion area in the epitaxial layer of the active area at both sides of the gate electrode.

5. The method of claim 4, wherein the spacers formed at the sidewalls of the gate electrode are adjacent to the silicon epitaxial layer and are formed on the silicon epitaxial layer at the sidewalls of the gate electrode.

* * * * *